US011062943B2

(12) United States Patent
Motoyama et al.

(10) Patent No.: US 11,062,943 B2
(45) Date of Patent: Jul. 13, 2021

(54) TOP VIA INTERCONNECTS WITH WRAP AROUND LINER

(71) Applicant: International Business Machines Corporation, Armonk, NY (US)

(72) Inventors: Koichi Motoyama, Clifton Park, NY (US); Nicholas Anthony Lanzillo, Troy, NY (US); Christopher J. Penny, Saratoga Springs, NY (US); Somnath Ghosh, Clifton Park, NY (US); Robert Robison, Rexford, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/536,785

(22) Filed: Aug. 9, 2019

(65) Prior Publication Data
US 2021/0043507 A1 Feb. 11, 2021

(51) Int. Cl.
*H01L 21/768* (2006.01)
*H01L 23/532* (2006.01)
*H01L 23/528* (2006.01)
*H01L 23/522* (2006.01)
*H01L 21/3213* (2006.01)
(Continued)

(52) U.S. Cl.
CPC ...... *H01L 21/76852* (2013.01); *H01L 21/288* (2013.01); *H01L 21/31144* (2013.01); *H01L 21/32136* (2013.01); *H01L 21/76802* (2013.01); *H01L 21/76843* (2013.01); *H01L 21/76877* (2013.01); *H01L 21/76897* (2013.01); *H01L 23/5226* (2013.01); *H01L 23/5283* (2013.01);
(Continued)

(58) Field of Classification Search
CPC ............ H01L 21/76852; H01L 21/288; H01L 21/31144; H01L 21/32136; H01L 21/76802
See application file for complete search history.

(56) References Cited

U.S. PATENT DOCUMENTS 5,595,943 A 1/1997 Itabashi et al.
7,655,564 B2 2/2010 Shinriki et al.
(Continued)

OTHER PUBLICATIONS

Z. Wu et al., "Pathfinding of Ru-Liner/Cu-Reflow Interconnect Reliability Solution," International Interconnect Technology Conference (IITC), Jun. 4-7, 2018, pp. 51-53.
(Continued)

*Primary Examiner* — Zandra V Smith
*Assistant Examiner* — Andre C Stevenson
(74) *Attorney, Agent, or Firm* — Randall Bluestone; Ryan, Mason & Lewis, LLP (57) ABSTRACT

A method includes patterning an interconnect trench in a dielectric layer. The interconnect trench has sidewalk and a bottom surface. A liner layer is deposited on the sidewalls and the bottom surface of the interconnect trench. The interconnect trench is filled with a first conductive metal material. The conducting metal material is recessed to below a top surface of the dielectric layer. A cap layer is deposited on a top surface of the first conductive metal material. The cap layer and the liner layer are of the same material. The method further includes forming a via on a portion of the interconnect trench.

20 Claims, 4 Drawing Sheets

(51) Int. Cl.
*H01L 21/288* (2006.01)
*H01L 21/311* (2006.01)

(52) U.S. Cl.
CPC .. *H01L 23/53238* (2013.01); *H01L 23/53257* (2013.01)

(56) References Cited

U.S. PATENT DOCUMENTS

| | | | |
|---|---|---|---|
| 8,610,276 B2 | 12/2013 | Yang et al. | |
| 9,230,912 B2* | 1/2016 | Hsu | H01L 23/53238 |
| 9,412,658 B2* | 8/2016 | Gluschenkov | H01L 21/76894 |
| 9,613,861 B2 | 4/2017 | Anderson et al. | |
| 9,859,215 B1 | 1/2018 | Edelstein et al. | |
| 10,020,224 B2 | 7/2018 | Anderson et al. | |
| 2008/0124484 A1 | 5/2008 | Shinriki et al. | |
| 2012/0061840 A1* | 3/2012 | Huang | H01L 21/76811 257/751 |
| 2012/0161320 A1 | 6/2012 | Akolkar et al. | |
| 2015/0171010 A1 | 6/2015 | Bristol et al. | |
| 2015/0357236 A1* | 12/2015 | Edelstein | H01L 23/53238 257/751 |
| 2018/0123038 A1* | 5/2018 | Lee | H01L 45/06 |
| 2020/0066629 A1* | 2/2020 | Schenker | H01L 21/76808 |
| 2020/0144107 A1* | 5/2020 | Dutta | H01L 23/528 |

OTHER PUBLICATIONS

C.C. Yang et al.., "Selective Chemical Vapor Deposition-Grown Ru for Cu Interconnect Capping Applications," Electrochemical and Solid-State Letters, 2010, pp. D33-D35, vol. 13. No. 5.

R. R. Patlolla et al., "CMP Development for Ru Liner Structures Beyond 14nm," ECS Journal of Solid State Science and Technology, 2018, pp. P397-P401, vol. 7, No. 8.

* cited by examiner

TOP VIA INTERCONNECTS WITH WRAP AROUND LINER

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front end of the line (FEOL), back end of the line (BEOL) and the section that connects those two together, the middle of the line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals with the bulk of the conductor being copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections. The formation of high quality interconnects is a critical part of ultra large-scale integration (ULSI) integrated circuits. In conventional fabrication processes, vias and upper wiring structures are formed, for example, in a dual damascene process. In this type of process, via openings and trenches are formed in a dielectric layer prior to the deposition of metal materials.

SUMMARY

According to an exemplary embodiment of the present invention, a method for fabricating a semiconductor device includes patterning an interconnect trench in a dielectric layer. The interconnect trench has sidewalls and a bottom surface. The method further comprises depositing a liner layer on the sidewalls and the bottom surface of the interconnect trench. The method further comprises filling the interconnect trench with a first conductive metal material. The method further comprises recessing the conducting metal material to below a top surface of the dielectric layer. The method further comprises depositing a cap layer on a top surface of the first conductive metal material. The cap layer and the liner layer are of the same material.

According to an exemplary embodiment of the present invention, a semiconductor structure includes a dielectric layer having at least one interconnect trench. The interconnect trench has sidewalk and a bottom surface. The semiconductor structure further comprises a liner layer disposed on the sidewalls and the bottom surface of the interconnect trench. The semiconductor structure further comprises a first conductive metal material disposed on the liner layer, wherein the first conductive metal material is recessed to a portion below a top surface of the dielectric layer. The semiconductor structure further comprises a cap layer disposed on a top surface of the first conductive metal material. The cap layer and the liner layer are of the same material.

These and other exemplary embodiments of the invention will be described herein or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

This disclosure relates generally to integrated circuits (IC), and more particularly to semiconductor ICs, and methods for their construction.

Exemplary embodiments of the invention will now be discussed in further detail with regard to integrated circuits and a method of manufacturing the IC, and more particularly to a barrier free contact for BEOL metal interconnects. High contact resistance between multi-level contacts in BEOL metal interconnects is a major hurdle for scaling due to highly resistive barrier liners (e.g., titanium nitride (TiN), tantalum nitride (TaN), etc.). For BEOL pitch below 30 nm, R/C delay is growing unsustainably large. The RC delay is the delay in signal speed through the circuit as the result of the resistance and capacitance of the circuit elements. However, it is still not sufficient to meet future contact resistance requirements due to the use of a highly resistive barrier liner. In addition, when a cap such as a cobalt (Co) cap is used with a liner such as a ruthenium (Ru) liner, thermal cycling results in the Co diffusing into the Ru liner region thereby depleting the Co cap on top and resulting in poor electromigration. Thus, embodiments described herein provide a barrier free contact formed in metal interconnects. In addition, embodiments described herein provide a top-via structure in which the bottom trench is fully encapsulated by a liner such the Ru liner. The liner provides superior gap-fill capability at narrow pitch. Also, the cap and liner fully encapsulate the metal in the trench thereby providing superior electromigration. The present disclosure presents improved interconnects to alleviate these problems.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for forming a barrier free contact for metal interconnects in a semiconductor device will be described below with reference to FIGS. 1A-7B. Note that the same reference numeral (100) is used to denote the semiconductor structure through the various intermediate fabrication stages illustrated in FIGS. 1A through 7B. Note also that the semiconductor structure described herein can also be considered to be a semiconductor device and/or an integrated circuit, or some part thereof.

Figure 1A:
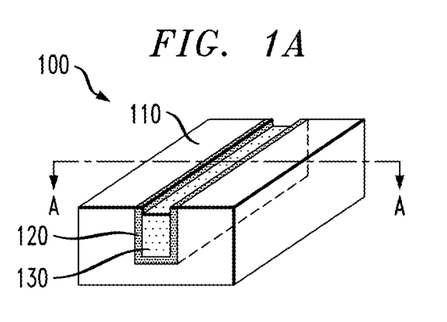
FIG. 1A is a perspective view illustrating a BEOL semiconductor structure for use in a method of manufacturing a semiconductor device, according to an exemplary embodiment of the present invention.
Figure 1B:
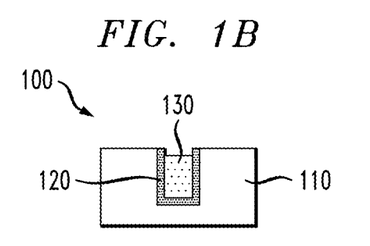
FIG. 1B is a cross-sectional view of a BEOL semiconductor structure taken along the A-A axis of FIG. 1A at a first-intermediate fabrication stage, according to an illustrative embodiment.

For example, according to an illustrative embodiment, FIG. TA illustrates a perspective view of a semiconductor structure 100 for use in forming a barrier free contact for BEOL metal interconnects in a semiconductor device. FIG. 1B illustrates a cross sectional view of a semiconductor structure taken along the A-A axis of FIG. 1A at a first-intermediate fabrication stage. For the purpose of clarity, several fabrication steps leading up to the production of semiconductor structure 100 as illustrated in FIGS. 1A and 1B are omitted. In other words, semiconductor structure 100 does not necessarily start out in the form illustrated in FIGS. 1A and 1B, but may develop into the illustrated structure over one or more well-known processing steps which are not illustrated but are well-known to those of ordinary skill in the art.

As shown in FIGS. 1A and 1B, the semiconductor structure 100 includes a trench formed in a dielectric material 110. The dielectric material 110 may include any suitable dielectric material, for example, silicon oxide, silicon nitride, hydrogenated silicon carbon oxide, silicon based low-k dielectrics, ultra low-k dielectrics, flowable oxides, porous dielectrics, or organic dielectrics including porous organic dielectrics. Non-limiting examples of suitable low-k dielectric materials include a spin-on-glass, a Plowable oxide, a high density plasma oxide, borophosphosilicate glass (BPSG), or any combination thereof. Ultra low-k dielectric materials are those having a dielectric constant, k, of 2.7 or less. Suitable ultra low-k dielectric materials include, for example, organic polymers, low k PECVD films containing Si, C, O and H and spin on organo-silicate glasses which have k values in the 2.7 to 2.0 range or lower. It is understood, however, that other materials having ultra low-k dielectric constant may be employed. The dielectric material 110 may be formed using any suitable deposition techniques including chemical vapor deposition (CVD), atomic layer deposition (ALD), plasma enhanced chemical vapor deposition (PECVD), physical vapor deposition (PVD), chemical solution deposition or other like processes. The dielectric material 110 is then planarized by, for example, a planarization process such as a chemical mechanical planarization (CMP).

In an illustrative embodiment, the trench can be formed using conventional processes. For example, a photoresist material formed on the dielectric material 110 is exposed to light to form a pattern (e.g., an opening). An interconnect trench is then formed in the dielectric material 110 by etching through the opening using conventional etchants in a reactive ion etching (RIE) process. The resist can then be removed using conventional stripants such as oxygen aching techniques.

A liner layer 120 is then formed in the interconnect trench, e.g., on vertical side surfaces and a bottom surface of the interconnect trench in the dielectric layer 110. Liner layer 120 can be any material that prevents electromigration. Suitable liner material includes, for example, ruthenium, cobalt, molybdenum, nickel, Ta or combinations thereof. In one embodiment, liner layer 120 is ruthenium. Liner layer 120 may be formed by any conventional deposition technique such as CVD, PECVD, PVD, sputtering, chemical solution deposition and plating. The thickness of the layer 120 can vary according to the type of layer being formed and the technique used in forming the same. For example, in illustrative embodiments, the thickness of the liner layer 120 on the sidewalls of the interconnect trench can range from about 0.5 to about 3 nanometers (nm) and the thickness of liner layer 120 on the bottom surface of the interconnect trench can range from about 0.5 to about 3 nm; although other dimensions are also contemplated by the present invention.

A metal layer 130 is then deposited on liner layer 120 to fill the trench. Suitable conductive metal material for metal layer 130 includes, for example, tungsten, titanium, tantalum, ruthenium, zirconium, cobalt, copper, aluminum, lead, platinum, tin, silver and gold. In one embodiment, metal layer 130 is copper. Metal layer 130 can be formed by any conventional deposition technique such as CVD, PECVD, PVD, sputtering, chemical solution deposition, electroplating and the like. Any residual material on the upper surface of the dielectric layer 110 can be removed using a conventional chemical mechanical polishing (CMP) process. Next, metal layer 130 in the trench is recessed by subjecting the metal layer 130 to a directional etching process such as a ME technique and wet technique.

Figure 2A:
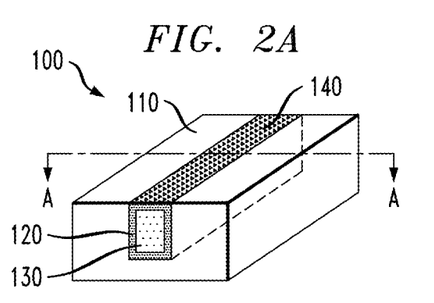
FIG. 2A is a perspective view illustrating a BEOL semiconductor structure at a second-intermediate fabrication stage, according to an exemplary embodiment of the present invention.
Figure 2B:
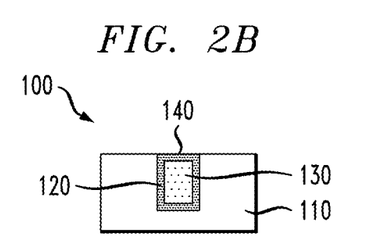
FIG. 2B is a cross-sectional view of a BEOL semiconductor structure taken along the A-A axis of FIG. 2A at a second-intermediate fabrication stage, according to an illustrative embodiment.

FIG. 2A illustrates a perspective view of semiconductor structure 100 and FIG. 2B illustrates a cross sectional view of semiconductor structure 100 taken along the A-A axis of FIG. 2A at a second-intermediate fabrication stage. As shown in FIGS. 2A and 2B, a cap layer 140 is deposited on the top surface of metal layer 130 filling the recessed portion of the trench. Cap layer 140 can be the same or different material as liner layer 120. In one embodiment, cap layer 140 is the same material as liner layer 120. In one embodiment, liner layer 120 and cap layer 140 are ruthenium. Cap layer 140 may be formed by any conventional deposition technique such as CVD, PECVD, PVD, sputtering, chemical solution deposition and plating. The thickness of the cap layer 140 can range from about 1 to about 5 nm.

Figure 3A:
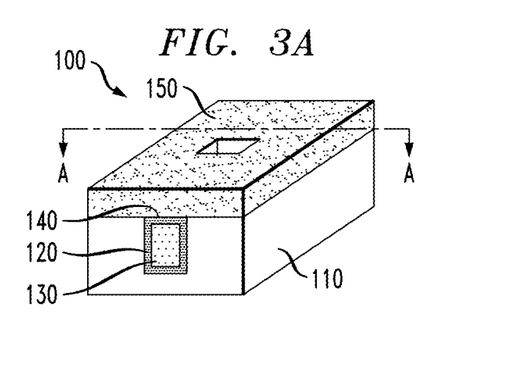
FIG. 3A is a perspective view illustrating a BEOL semiconductor structure at a third-intermediate fabrication stage, according to an exemplary embodiment of the present invention.
Figure 3B:
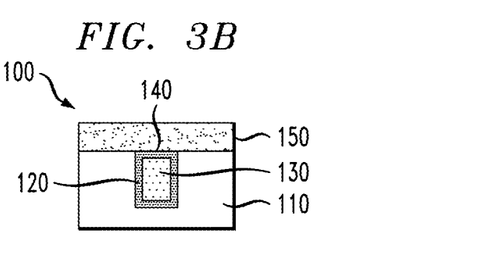
FIG. 3B is a cross-sectional view of a BEOL, semiconductor structure taken along the A-A axis of FIG. 3A at a third-intermediate fabrication stage, according to an illustrative embodiment.
Figure 4A:
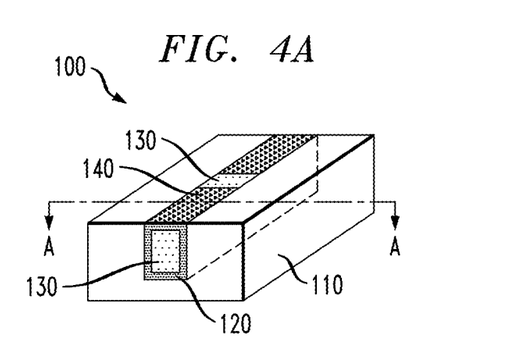
FIG. 4A is a perspective view illustrating a BEOL semiconductor structure at the third-intermediate fabrication stage without the hardmask, according to an exemplary embodiment of the present invention.
Figure 4B:
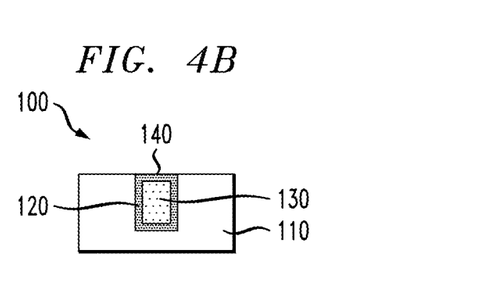
FIG. 4B is a cross-sectional view of a BEOL semiconductor structure taken along the A-A axis of FIG. 4A at the third-intermediate fabrication stage, according to an illustrative embodiment.

FIG. 3A illustrates a perspective view of semiconductor structure 100 and FIG. 3B illustrates a cross sectional view of semiconductor structure 100 taken along the A-A axis of FIG. 3A at a third-intermediate fabrication stage. As shown in FIGS. 3A and 3B, a mask (photoresist) 150 is formed over dielectric layer 110 and cap layer 140. The mask 150 is exposed to light to form a pattern, e.g., a via opening aligned with the integrally formed trench structure. The vertical via opening is formed in the mask 150 by conventional etching processes, e.g., a RIE process, to expose the top surface of cap layer 140. As one skilled in the art will understand, cap layer 140 advantageously protects the underlying metal layer 130 during this process. Next, an additional directional etching process such as a RIE technique is carried out to remove the top surface of cap layer 140 in the opening thereby exposing the top surface of metal layer 130 (see FIGS. 4A and 4B showing the semiconductor structure 100 of FIGS. 3A and 3B without the mask 150).

Figure 5A:
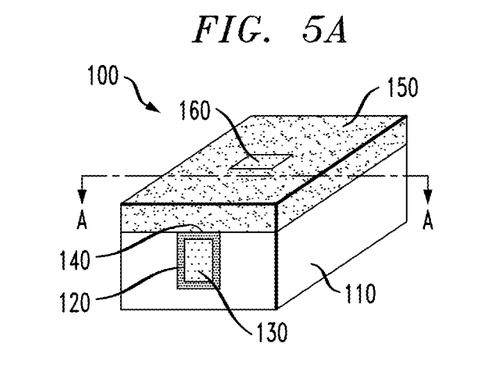
FIG. 5A is a perspective view illustrating a BEOL semiconductor structure at a fourth-intermediate fabrication stage, according to an exemplary embodiment of the present invention.
Figure 5B:
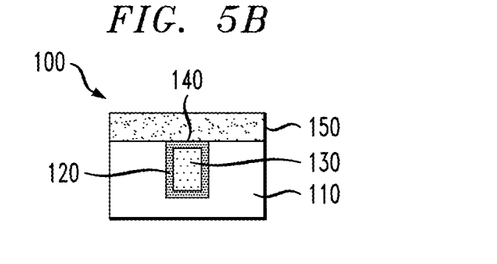
FIG. 5B is a cross-sectional view of a BEOL semiconductor structure taken along the A-A axis of FIG. 5A at a fourth-intermediate fabrication stage, according to an illustrative embodiment.

FIG. 5A illustrates a perspective view of semiconductor structure 100 and FIG. 5B illustrates a cross sectional view of semiconductor structure 100 taken along the A-A axis of FIG. 5A at a fourth-intermediate fabrication stage. As shown in FIGS. 5A and 5B, a metal fill 160 is formed in the via opening by, for example, an electroless plating technique. Suitable conductive metal material for metal fill 160 includes, for example, any of the metal material discussed above for metal layer 130. In one embodiment, the metal material for metal fill 160 is different than the metal material for metal layer 130. In one embodiment, the metal material for metal fill 160 is the same as the metal material for metal layer 130.

In an illustrative embodiment, metal fill 160 can be formed by dipping semiconductor structure 100 in an electroless plating solution containing an inhibitor for cathodic partial reaction of electroless plating and then depositing the conductive metal and filling the via opening in the mask 150 under stirring of the plating solution. In this manner, a conductor circuit can be formed. In the method, a concentration of the inhibitor in the electroless plating solution is $1 \times 10^{-6}$ to $2 \times 10^{-4}$ mol/l. A suitable inhibitor includes, for example, at least one of mercury, silver, zinc, tin, lead, iron, cobalt, arsenic, antimony, indium, cadmium, nickel and bismuth. In one embodiment, the electroless plating solution is a copper plating solution and the inhibitor is at least one of lead, mercury, silver, zinc, tin, iron, cobalt, nickel and bismuth. As one skilled in the art will understand, by adding to the electroless plating solution a material which inhibits the cathodic partial reaction of electroless plating, the electroless plating automatically stops when the plating surface reaches the same level as the surface of resist which controls width or position of the conductor circuit or the surface of the semiconductor structure 100 (FIG. 5A). In this case, however, it is necessary to stir the electroless plating solution for leveling the surface of the conductor and the surface of the insulating substrate.

The surface layer of the leveled conductor circuit formed upon automatic stopping of the electroless plating reaction is higher in content of the inhibitor than the inner portion. This difference in the content of the inhibitor between the inner portion and the surface portion of the conductor can be measured, for example, by analysis in the depth direction using Auger electron spectroscopy (hereinafter referred to as "ABS") or secondary ion mass spectroscopy (hereinafter referred to as "SIMS") or by preparing a leaf sample of the section of the resulting conductor circuit by microtome method or ion milling method using a focused ion beam and observing it by a transmission electron microscope.

In one embodiment, in the case where the electroless plating is copper plating, at least one ion of lead, mercury, silver, zinc, tin, iron, cobalt, nickel and bismuth inhibitor can be used. In another embodiment, in the case where the electroless plating is nickel plating, at least one ion of lead, copper, mercury, zinc, tin, bismuth, antimony, cobalt, arsenic, indium and cadmium inhibitor can be used. In one embodiment, in the case where the electroless plating is cobalt plating, at least one ion of lead, copper, mercury, zinc, tin, bismuth, antimony, nickel, arsenic, indium and cadmium inhibitor can be used. Since the inhibitor is consumed by the electroless plating reaction, it is important to add the inhibitor in accordance with the amount of the deposited metal.

The surface layer of the conductive metal containing the inhibitor in a large amount can be easily cleaned by etching the inhibitor, and therefore, when a conductive metal is further formed thereon, good connection can be attained. For example, when copper is formed as the conductive metal and lead is added as the inhibitor, the surface of the conductor circuit is covered with lead. When this substrate is dipped in an etching solution mainly composed of acetic acid, the copper as the conductor metal is hardly etched and the lead covering the surface can be easily etched. Therefore, there are no problems encountered in conventional methods, such as insufficient cleaning of the surface of the conductor circuit and excessive etching.

Figure 6A:
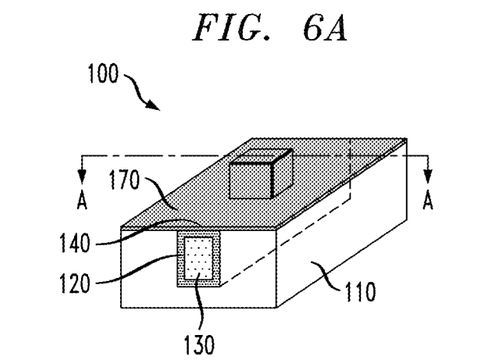
FIG. 6A is a perspective view illustrating a BEOL semiconductor structure at a fifth-intermediate fabrication stage, according to an exemplary embodiment of the present invention.
Figure 6B:
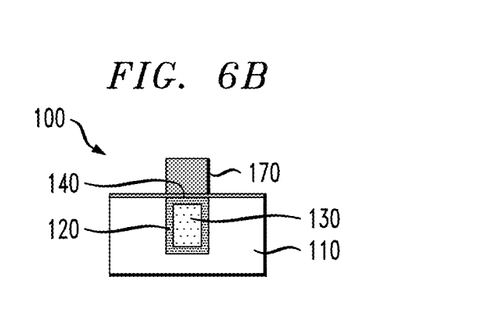
FIG. 6B is a cross-sectional view of a BEOL semiconductor structure taken along the A-A axis of FIG. 6A at a fifth-intermediate fabrication stage, according to an illustrative embodiment.

FIG. 6A illustrates a perspective view of semiconductor structure 100 and FIG. 6B illustrates a cross sectional view of semiconductor structure 100 taken along the A-A axis of FIG. 6A at a fifth-intermediate fabrication stage. As shown in FIGS. 6A and 6B, mask 150 is first removed using conventional stripants such as oxygen ashing techniques leaving an integrally formed top via structure, i.e., metal fill 160, in self-alignment with the interconnect trench which is underneath the integrally formed top via structure. Next, a refractory metal layer 170 is deposited on the top surface of dielectric layer 110 and liner layer 120 and over the exposed surfaces of metal fill 160. Refractory metal layer 170 can be any material that prevents Cu diffusion, e.g., TaN, TiN, WN or combinations thereof. Refractory metal layer 170 can be formed using any conventional deposition technique such as CVD, PECVD, PVD, sputtering, ALD or other like deposition processes. In one embodiment, the thickness of refractory metal layer 170 on the sidewalls of metal fill 160 can range from about 0.5 to about 3 nm and the thickness of liner layer 170 on the top surface of dielectric layer 110, liner layer 120 and metal fill 160 can range from about 0.5 to about 3 nm; although other dimensions are also contemplated by the present invention.

Figure 7A:
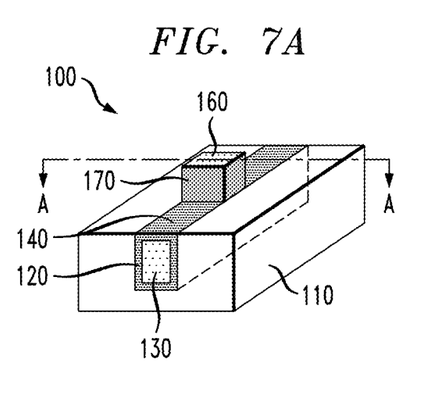
FIG. 7A is a perspective view illustrating a BEOL semiconductor structure at a sixth-intermediate fabrication stage, according to an exemplary embodiment of the present invention.
Figure 7B:
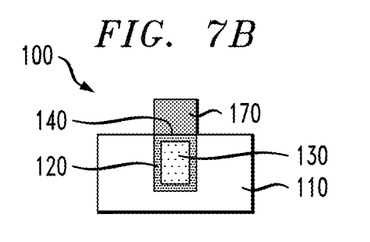
FIG. 7B is a cross-sectional view of a BEOL semiconductor structure taken along the A-A axis of FIG. 7A at a sixth-intermediate fabrication stage, according to an illustrative embodiment.

FIG. 7A illustrates a perspective view of semiconductor structure 100 and FIG. 7B illustrates a cross sectional view of semiconductor structure 100 taken along the A-A axis of FIG. 7A at a sixth-intermediate fabrication stage. As shown in FIGS. 7A and 7B, the refractory metal layer 170 is removed from the top surface of dielectric layer 110, liner layer 120 and metal fill 160 leaving refractory metal layer 170 on the sidewalls of metal fill 160. The refractory metal layer 170 can be removed from the top surface of dielectric layer 110, liner layer 120 and metal fill 160 using a directional etching process which removes a selected material, i.e., the refractory metal layer 170, from all horizontal surfaces of a structure, while maintaining a portion of the selected material, i.e., the refractory metal layer 170, on all vertical surfaces of the structure. In one embodiment of the present application, the directional etching process that can be used in providing the structure shown in FIG. 7A includes a sputter etching process. In one example, sputter etching can be performed utilizing an argon plasma.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor structure, comprising:
    patterning an interconnect trench in a dielectric layer, wherein the interconnect trench has sidewalls and a bottom surface;
    depositing a liner layer on the sidewalls and the bottom surface of the interconnect trench;
    filling the interconnect trench with a first conductive metal material;
    recessing the first conductive metal material to below a top surface of the dielectric layer;
    depositing a cap layer on a top surface of the first conductive metal material;
    forming a hardmask on a top surface of the dielectric layer and the cap layer;
    patterning the hardmask to form a via opening in the hardmask exposing the top surface of the cap layer;
    etching the cap layer in the via opening to expose the top surface of the first conductive metal material;
    filling the via opening with a second conductive metal material;
    removing the hardmask leaving a via structure in alignment with the interconnect trench; and
    forming a refractory metal layer on sidewalls of the via structure.

2. The method according to claim 1, wherein the semiconductor structure is formed as part of a back-end-of-line structure.

3. The method according to claim 1, wherein the dielectric layer comprises an ultra low-k dielectric material.

4. The method according to claim 1, wherein the liner layer and the cap layer comprise one or more of ruthenium, cobalt, molybdenum, and nickel, and the first conductive metal material comprises one or more of tungsten, titanium, tantalum, ruthenium, zirconium, cobalt, copper, aluminum, lead, platinum, tin, silver, and gold, wherein the liner layer and the cap layer are different than the first conductive metal material.

5. The method according to claim 1, wherein the liner layer and the cap layer are ruthenium and the first conductive metal material is copper.

6. The method according to claim 1, wherein forming a refractory metal layer on sidewalls of the via structure comprises:
depositing the refractory metal layer on the top surface of the dielectric layer and the cap layer and over the via structure; and
removing the refractory metal layer from the top surface of the dielectric layer, the cap layer and the via structure leaving the refractory metal layer on the sidewalls of the via structure.

7. The method according to claim 1, wherein the first conductive metal material is different than the second conductive metal material.

8. The method according to claim 1, wherein the liner layer, the cap layer and the second conductive metal material are ruthenium and the first conductive metal material is copper.

9. The method according to claim 6, wherein the refractory metal layer is removed from the top surface of the dielectric layer, the cap layer and the via structure with an argon plasma etch.

10. The method according to claim 1, wherein the refractory metal layer is TaN.

11. The method according to claim 1, wherein a thickness of the liner layer on the sidewalls of the interconnect trench is from about 0.5 to about 3 nanometers (nm) and the thickness of the liner layer on the bottom surface of the interconnect trench is from about 0.5 to about 3 nm.

12. A semiconductor structure comprising:
a dielectric layer having at least one interconnect trench, wherein the interconnect trench has sidewalls and a bottom surface;
a liner layer disposed on the sidewalls and the bottom surface of the interconnect trench;
a first conductive metal material disposed on the liner layer, wherein the first conductive metal material is configured to be below a top surface of the dielectric layer;
a cap layer disposed on a portion of a top surface of the first conductive metal material; and
a via structure disposed on and in alignment with the at least one interconnect trench, wherein the via structure comprises a second conductive metal material disposed on the first conductive metal material;
wherein sidewalls of the via structure have a refractory metal layer disposed thereon.

13. The semiconductor structure according to claim 12, wherein the semiconductor structure is formed as part of a back-end-of-line structure.

14. The semiconductor structure according to claim 12, wherein the first conductive metal material is different than the second conductive metal material.

15. An integrated circuit comprising:
one or more semiconductor structures, wherein at least one of the one or more semiconductor structures comprises:
a dielectric layer having at least one interconnect trench, wherein the interconnect trench has sidewalls and a bottom surface;
a liner layer disposed on the sidewalls and the bottom surface of the interconnect trench;
a first conductive metal material disposed on the liner layer, wherein the first conductive metal material is configured to be below a top surface of the dielectric layer;
a cap layer disposed on a portion of a top surface of the first conductive metal material; and
a via structure disposed on and in alignment with the at least one interconnect trench, wherein the via structure comprises a second conductive metal material disposed on the first conductive metal material;
wherein sidewalls of the via structure have a refractory metal layer disposed thereon.

16. The integrated circuit according to claim 15, wherein the first conductive metal material is different than the second conductive metal material.

17. The integrated circuit according to claim 15, wherein the refractory metal layer is TaN.

18. The integrated circuit according to claim 15, wherein the liner layer and the cap layer comprise one or more of ruthenium, cobalt, molybdenum, and nickel, and the first conductive metal material comprises one or more of tungsten, titanium, tantalum, ruthenium, zirconium, cobalt, copper, aluminum, lead, platinum, tin, silver, and gold, wherein the liner layer and the cap layer are different than the first conductive metal material.

19. The integrated circuit according to claim 15, wherein the liner layer and the cap layer are ruthenium and the first conductive metal material is copper.

20. The semiconductor structure according to claim 12, wherein the refractory metal layer is TaN.

* * * * *